United States Patent [19]

Cavigelli

[11] 4,169,996

[45] Oct. 2, 1979

[54] OPERATIONAL AMPLIFIER WITH SLEW RECOVERY ENHANCEMENT

[75] Inventor: George A. Cavigelli, Lexington, Mass.

[73] Assignee: American Optical Corporation, Southbridge, Mass.

[21] Appl. No.: 909,095

[22] Filed: May 24, 1978

[51] Int. Cl.$^2$ .............................................. H03F 1/36
[52] U.S. Cl. ..................................... 330/99; 315/388; 330/69; 330/100; 330/103
[58] Field of Search .................. 315/388, 389; 330/69, 330/103, 99, 100, 259, 260

[56] References Cited

U.S. PATENT DOCUMENTS

| | | | |
|---|---|---|---|
| 3,569,849 | 3/1971 | Cassidy | 330/260 X |
| 3,747,006 | 7/1973 | Freeborn | 330/69 X |

Primary Examiner—Lawrence J. Dahl
Attorney, Agent, or Firm—Jeremiah J. Duggan; Alan H. Spencer; Stephen A. Schneeberger

[57] ABSTRACT

Improved slew recovery in a composite driving amplifier for driving a substantially reactive load including a feedback loop to the operational amplifier from the load for regulating the output of the amplifier, the composite amplifier has a predetermined resistance R1 in the feedback loop and includes a second feedback loop having a predetermined resistance R2. The second feedback loop extends from the output of the operational amplifier to the negative input and is substantially parallel with the first-mentioned feedback loop. To maximize the recovery of the amplifier from a slew condition, the relationship of R1-R2 should be as follows:

$$\frac{V_o \left( \frac{R1}{R1 + R2} \right)}{\text{SLOPE}} \geq \text{DELAY}$$

wherein:

$V_o$ is the output voltage in the amplifier.

SLOPE, is the slope of the load voltage curve during the overload condition, and DELAY represents the period of time it takes the overload operational amplifier to respond to a feedback signal at a given overload condition.

3 Claims, 18 Drawing Figures

OPERATIONAL AMPLIFIER WITH SLEW RECOVERY ENHANCEMENT

BACKGROUND OF THE INVENTION

This invention relates to operational amplifiers for use in electronic apparatus wherein the amplifier is required to respond to rapid large shifts in the input signal. Such applications are commonly found in the drive circuits for cathode ray tubes, particularly in those instruments wherein the cathode ray tube displays data which is collected at one rate and is speeded up and compressed for display purposes. Such instruments are common in cardiac monitoring.

As may well be expected in monitoring of physiological signals, it is a requirement that the output voltage or current of the operational amplifiers making up the current drives for the display tube bear as precise a relationship as possible with the input voltage or current (e.g. the physiological information). It is well-known that amplifiers in general have limits on how fast their output may respond to an input command. This limit is generally spoken of in terms of slew rate and is defined usually as the maximum rate of change of the output voltage of an amplifier in response to an input offset voltage.

The limitations on slew rate are characteristically due to the limited amount of power available within an operational amplifier system to change the energy stored in the load being powered by the amplifier. As may well be expected, the problems of maximizing slew rate become particularly critical when the load is largely reactive, i.e. inductive or capacitive. In those installations when the operation amplifier is driving the yoke of a cathode ray tube, this critical problem is observed since the amplifier load is largely inductive. The problem is further complicated when, as in the case of cardiac monitors, information is gathered at one rate and displayed at a rate of, for example, 1000X the collection rate. As may be appreciated, in such instances when there is a large swing from one voltage level to a second level, the recovery problems for the amplifier following the rapid slew of voltage are substantial.

In such instruments as multi-channel, non-fade displays which are used as bedside monitors in hospital intensive or coronary care units, physiological conditions normally expressed in milliseconds become, by virtue of data compression for presentation, in the microsecond range. Others have solved the demanding time requirements of these physiological monitors by using a TV-type raster scanning and providing the display through the modulation of the beam intensity, as opposed to using a true X-Y deflection scheme. In such TV-type monitor installations, a comparatively small amount of energy change is necessary to brighten up the spot of the beam being scanned in one of the traditional raster patterns so the slew problem is not exhibited. Likewise, there is ample prior art in the building of raster generators to power such systems.

There are certain advantages, however, to a true X-Y presentation of the physiological signals on a CRT monitor. Among these are included the continuous display of the information by a beam which is writing a continuous trace on the tube face. It is held in some medical circles that such a display is more stable and easy to interpret as by giving a more crisp definite display on the cathode ray tube.

It must be appreciated, however, that in order to insure a clear, crisp accurate presentation or display of the physiological signals upon the screen, that the slew rate of the Y-axis deflection amplifier must be equivalent to the system demand. In such displays, the input signal level is traditionally in the region of one millivolt and the response time, as previously mentioned, is a compressed data display in the order of microseconds. This low level input signal must be converted into a yoke drive current in the order of one amp. Thus, it may be seen that if overshoot, which is a common observable characteristic of an amplifier operated beyond the slew rate capability, is to be kept to an acceptable minimum, for example, 50 microvolts, the problem faced is the design of such an amplifier wherein a response time of approximately 50 nanoseconds is achieved.

I have determined that an operational amplifier for driving a highly reactive load such as the Y-axis of a CRT can be modified with additional circuit elements so as to anticipate potential overshoot when operated in slew. By anticipating the otherwise normal overshoot, the time required for the amplifier to stablize after a slew condition may be reduced and additionally the overshoot itself may be minimized or eliminated.

SUMMARY OF THE INVENTION

Improved slew recovery in a composite operational amplifier for driving a substantially reactive load including an operational amplifier and a slew-limited driving amplifier having a feedback loop to the operational amplifier from the load for regulating the output of the amplifier to the load having a predetermined resistance R1 in the feedback loop and the inclusion of a second feedback loop having a predetermined resistance R2 to regulate the approach of the amplifier to stabilized operation in response to the changed input signal. The second feedback loop extends from the output terminal of the operational amplifier to its negative input and is substantially parallel with the first-mentioned feedback loop. To maximize the recovery of the amplifier from a slew condition, the relationship of R1-R2 should be as follows:

$$\frac{V_o \left( \frac{R1}{R1 + R2} \right)}{\text{SLOPE}} \geq \text{DELAY}$$

wherein $V_o$ is the output voltage in the amplifier,

SLOPE is the slope of the load voltage curve at the load current sensor during the overload condition, and DELAY represents the period of time it takes the operational amplifier to respond to a feedback signal of a given overload condition (normally expressed in microseconds). These and other objectives will be evident from the appended Description of a Preferred Embodiment of the Invention.

DESCRIPTION OF A PREFERRED EMBODIMENT

Figure 1:
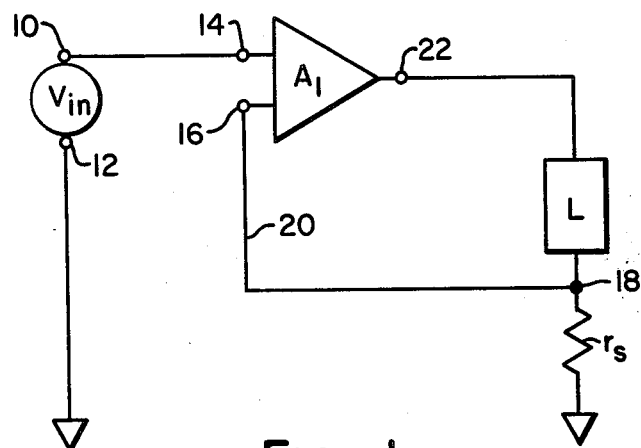
FIG. 1 is a schematic drawing of an operational amplifier supplying an inductive load.

Referring now to the drawings and specifically to FIG. 1, a circuit is illustrated representing a conventional driving of a load L such as the Y-axis coil of the yoke of a cathode ray tube. The amplifier A1 represents a typical operational amplifier for supplying the attached load. It should be appreciated that the amplifier A1 may be made up of a single active element such as a transistor or vacuum tube, or a combination thereof, which would promote certain operational characteristics of the operational amplifier. Input terminals 10 and 12 are represented between which the input voltage $V_{in}$ is applied.

For the purposes of discussion, FIGS. 2a–d illustrates electrical activity within the circuit illustrated in FIG. 1 upon the application of a step function at the input terminals 10 and 12. This input is represented as $V_{in}$ in FIG. 2a, and as may be seen represents a change in voltage from level 0 to level 1. The input voltage is reflected at terminal 14 of the operational amplifier A1.

Terminal 18 represents the traditional feedback point for regulation of a current to a load L being at the output side of load L and across the sensing resistor $r_s$. The voltage at terminal 18 is reflected back to operational amplifier A1 at terminal 16 over feedback loop 20. The error voltage $V_{error}$ is illustrated in FIG. 2b. The error prior to time T1 when the input voltage steps to the one state is zero (0) and at T1 steps to a value reflecting the instantaneous difference of input to total circuit output voltage. As the load current increases, the error voltage diminishes until the new steady state condition is arrived at.

FIG. 2c illustrates the voltage at terminal 22 $V_{22}$ of the operational amplifier A1, being at a zero level until time T1 when the input signal is stepped up to $V_o$ level. At this point in time, the output of the operational amplifier steps up, going as positive as possible within the limits of the system (the operational limit of the amplifier load combination). Instantaneous response of the amplifier would require "infinite" voltage capacity. Since such is not possible in practical systems, the load current curve exhibits a slope of other than infinity and "time" is required to reach the new steady state condition. Accordingly then, the amplifier A1 which is preferably designed for maximum slew rate applies its maximum output voltage to raise the current in the inductor L to the new required level its at maximum rate thereby applying a step output to the load so long as the error voltage $V_{error}$ as illustrated in FIG. 2b persists.

Correspondingly, FIG. 2c illustrates the voltage at load L from the amplifier wherein after application of the step input at time T1, the load current rises at the maximum capacity of the amplifier to assume the one state (e.g. new steady state) at time T2 consistent with the operational characteristic of amplifier A1. At the time in T2 when the voltage at terminal 18 reaches a level corresponding to the input level such that zero error exists as illustrated in FIG. 2b, operational amplifier A1 returns to the zero state. Correspondingly, FIG. 2d illustrates that the output current linearly increases from 0 at time T1 to unity level (new steady state) at time T2.

Figure 2:
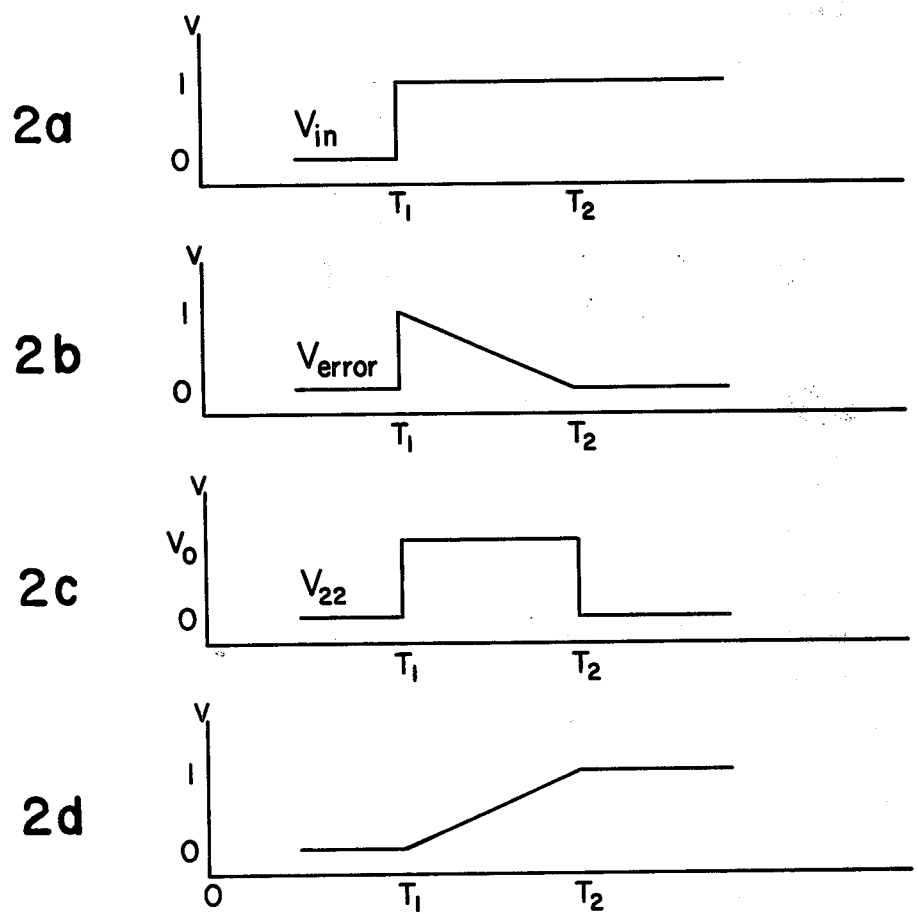
FIGS. 2a–d are simplified voltage versus time graphs of the circuit of FIG. 1 under a step input response.

The illustrations in FIG. 2 represent theorethical responses to the input voltage of FIG. 2a assuming instantaneous responses and absolute linear operation.

Figure 3:
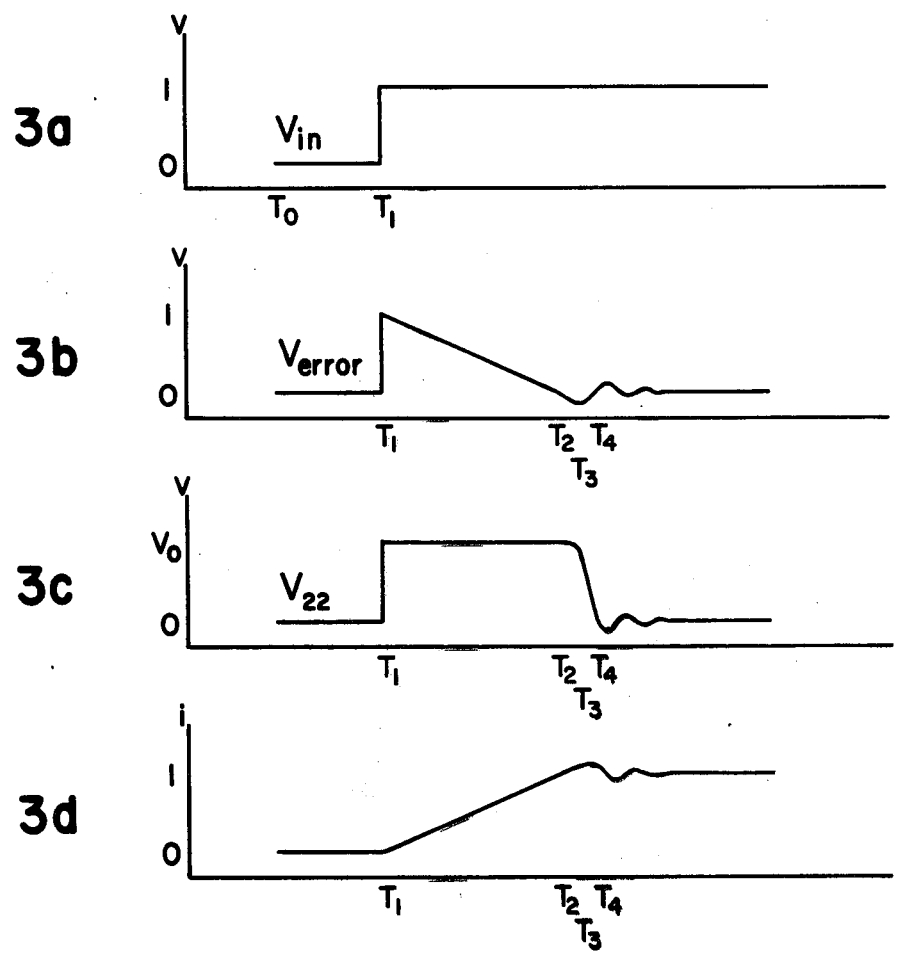
FIGS. 3a–d are a series of voltage-versus-time curves for the circuit of FIG. 1 under a step of input wherein the amplifier exhibits delay in its overdrive response due to the input overdrive condition.

As previously mentioned it is recognized, however, that there are certain inherent response times in a circuit configuration. It should be appreciated that amplifier A1 of FIG. 1 is operating at its maximum capability and supplying comparatively high output to load L. Thus, due to its internal slew liminations, namely, ability to switch immediately from one level to a subsequent one, there is an inherent delay in operation which results in an overdrive of the overall circuit. This feature is illustrated in FIGS. 3a–d. As in FIG. 2, the input voltage $V_{in}$ is represented in FIG. 3a as being shown initially in a zero state at time $T_o$. At time $T_1$, the input voltage is stepped to level 1 and remains there for the purposes of discussion. Consistently with diagrams of FIG. 2, the error voltage shown in FIG. 3b steps from the zero level to the one level at time $T_1$ and the amplifier A1 goes from operation at the zero level to the one level therewith. As illustrated in FIG. 3d, the output current at terminal 18 begins its rise in response to the maximum output of amplifier A1. These states continue until time T2 when the new output of amplifier A1 reaches its goal, namely, the error signal, and as illustrated in FIG. 3b, it is reduced down to zero level. At this time, as is illustrated in FIG. 3d, the output current has achieved the desired one state. It will be observed, however, in FIG. 3c that the output of amplifier A1 does not immediately return to the zero state, rather, remaining at the one state for a period of time until T3. This additional period of time may be characterized as the time delay of amplifier A1. Thus, during this interval of continued output by A1, it may be seen that the error level of FIG. 3b is reduced below the zero level becoming negative now, toward some value and correspondingly the output current due to the continued operation of A1 has overshot the one level and continue rising past time T3. It can be seen from FIG. 3c that there will be continued output from amplifier A1 for a short duration after time T3, during which the amplifier's output slews down to the zero point. At time T4, when the output of amplifier A1 reaches the zero level, further rise of the output current ceases, as is indicated at FIG. 3d. At this point in time the output error of current is maximized. The overshoot and error are maximized as is indicated at T4 in FIG. 3b and the amplifier then begins a stabliizing process wherein feedback over line 20 causes A1 to stabilize at the zero level thereby maintaining the new output current at the one level is illustrated in FIG. 3d.

I have determined that the slew rate recovery of slew limited amplifier can be materially improved by substantially preventing the load from seeing the overshoot caused by the slew. I accomplished this by adding a feedback circuit to correct for the inherent delay of the amplifier in responding to its input signal. In so many words, the amplifier anticipates its response time during which the inertia of the amplifier, as it were, would otherwise cause overshooting and undershooting. Thus, the final increment of the output of the amplifier is corrected so as to arrive at the final steady state value "knowing" that it has, and is at other than "full on".

In the general sense, a driving amplifier may be considered as a current source when supplying an inductive load and as a voltage source to a capacitive load. As mentioned previously, instantaneous response is practically impossible, since the driving amplifier would be required to exhibit infinite voltage capacity or infinite current capacity.

For example in the inductive situation to achieve a step current response where L (inductance) is large:

$$V_L = \frac{dI_L}{dt} \cdot L$$

where $V_L$ is the voltage across the inductor, e.g. load voltage. To achieve the step response, the instantaneous current response $(dI_L)/dt$ must approach infinity.

And for the corresponding situation $$I_C = \frac{dV_c}{dt} \cdot C$$

Where the capacitance (C) is large, $dV_c/c+$ is the measure of load performance, i.e. to initiate a step response of load current (charge to the capacitor) the change of current to the capacitor $I_c$ would have to approach infinity.

Since the instantaneous response in either case is impossible (or grossly impractical since the driving amplifier would have to have tremendously large relative voltage or current) the supply capacity, with respect to the remainder of the circuit, of the driving amplifier is reached and the amplifier is "over driven". This means it operates in slew (maximum response to an input) until such time as the regulating portion of the composite circuit signals the reaching of the output requirement and a return to steadly state operation.

Figure 4:
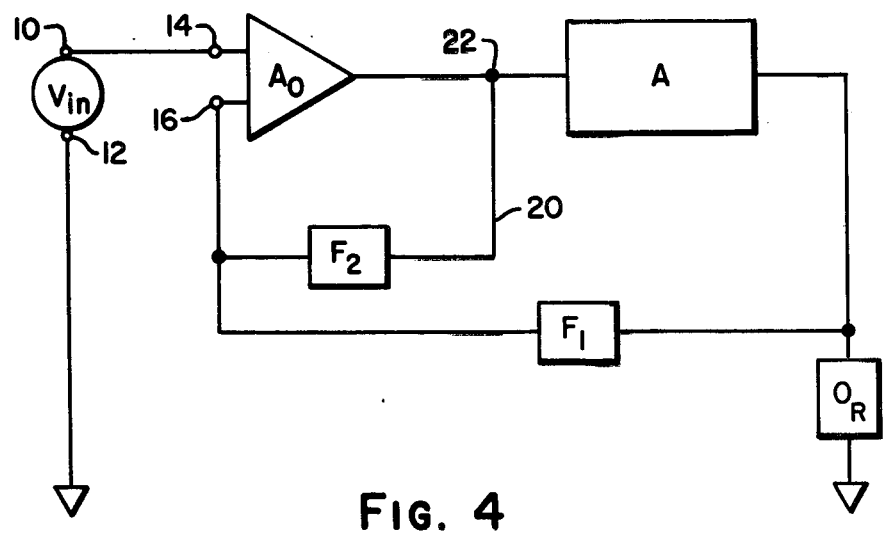
FIG. 4 is a schematic drawing of the present invention incorporating compensation for slew limitation exhibited by an overdriven amplifier supplying a reactive load.

In the most general symbolic description of the invention of FIG. 4, the load may be either inductive or capacitive, since in the theoritical sense, the load condition is monitored through an output regulator $O_r$. The input signal is applied to an operational amplifier $A_o$ at terminal 14'. The output of that amplifier controls the output of the slew limited driving amplifier A, the output of which goes to the output load regulator $O_r$. The feedback circuits $F_1'$ and $F_2'$ are as illustrated. Where the load is inductive as in FIG. 5 the output regulator is a load regulating resistance $r_s$ and the load (the inductor) is supplied serially by the driver A.

Figure 5:
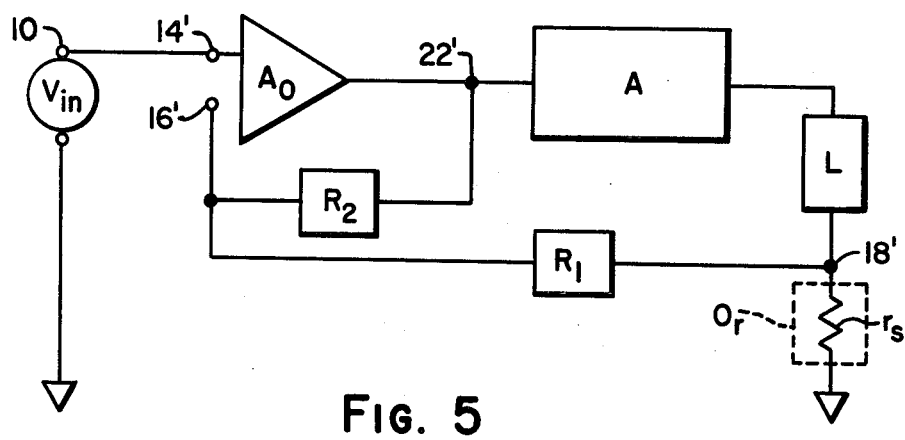
FIG. 5 is an embodiment of the invention illustrated in FIG. 4, wherein the load to be driven is inductive.

Referring now to FIG. 5, for a more detailed understanding of the invention and the inductive load condition of a CRT it will be seen that I have added resistance R1 as the normal feedback loop for amplifier control. It will also be apparent that I have added second feedback R2 from terminal 22' to terminal 16'. As previously stated, the ratio of R1-R2 are selected according to the delay of the slew limited driving amplifier A', taking into consideration the operational characteristics of the amplifier in conjunction with the load. The overall circuit characteristic of delay is corrected for by determining the "response" time in overload and adding the appropriate feedback voltage. In such situations to determine the values of R1 and R2 necessary to optimize the slew rate recovery, the following approximatings may be made. The "anticipation" should be equal to, or larger than the "delay". Delay is represented by the X value of the voltage/time curve in overshoot. The overshoot voltage developed during the "delay" is represented on the Y-axis of the voltage/time curve. Since this overshoot voltage may be avoided by a shut-down of the amplifier response by an equal earlier amount, that voltage represents the feedback signal necessary to "anticipate" the amplifier response. This feedback voltage may be represented as:

$$V_f = V_o \frac{R1}{R1 + R2}$$

Since the slope of the load current response curve is known from FIG. 3d, the delay may be respresented as:

$$\text{Delay} = \frac{V_f}{\text{Slope}} \text{ or } \frac{V_o \frac{R1}{R1 + R2}}{\text{slope}}$$

Figure 6:
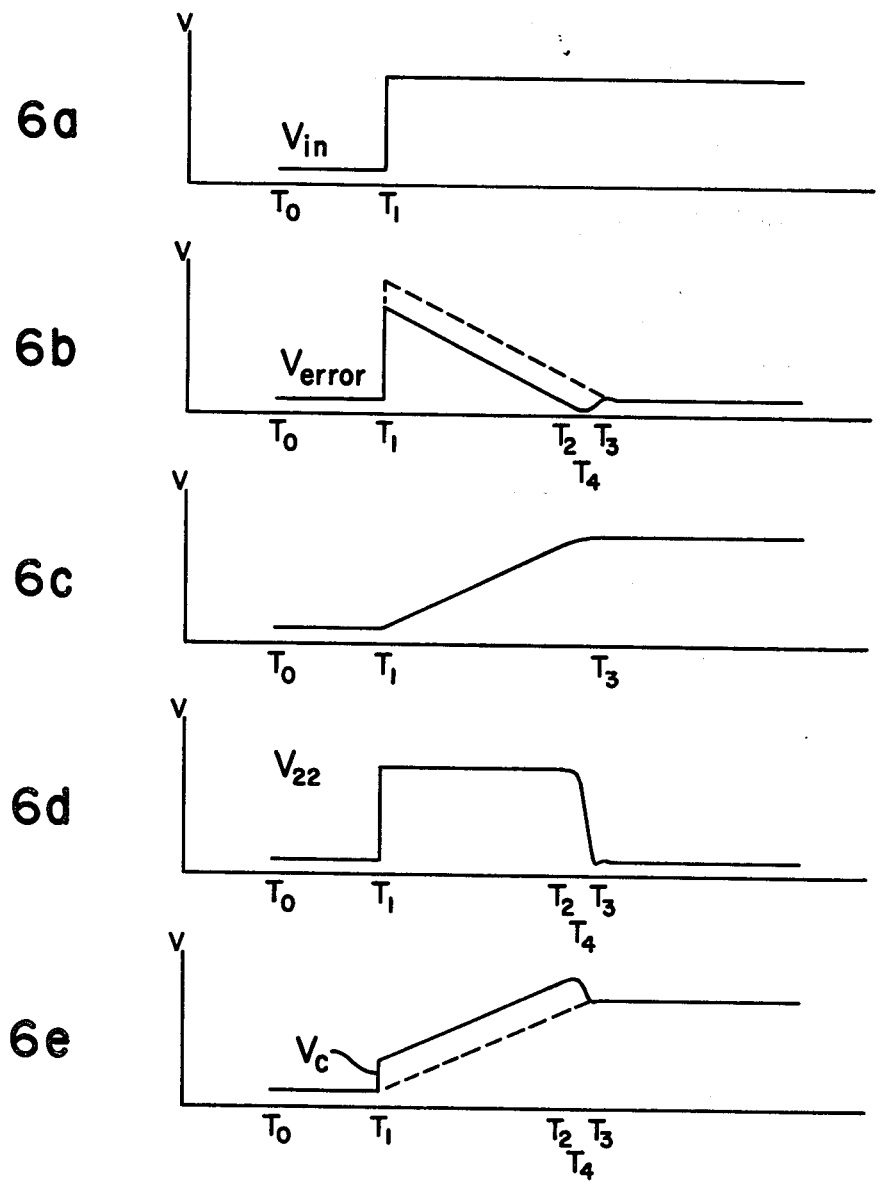
FIGS. 6a–e are voltage-to-time curves illustrating the corrective action of the present invention.

By following the teachings of the present invention and referring to FIG. 6, it will be observed that the abovedescribed circuit has the following impact upon the various voltages existing within the amplifier and load circuit.

Figure 7:
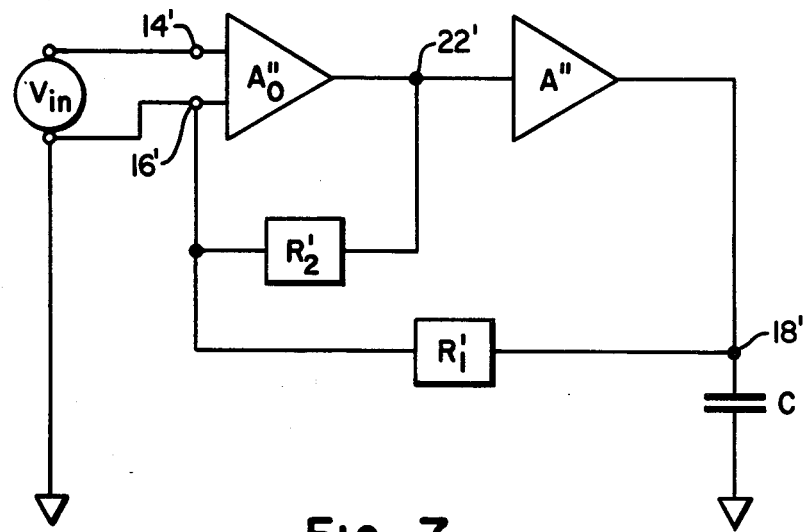
FIG. 7 is an embodiment of the invention illustrated in FIG. 4, wherein the load to be driven is capacitive.

FIG. 6a represents the step input in voltage $V_{in}$ comparable to FIGS. 2a and 3a. FIG. 6b represents the error signal $V_{error}$ to the amplifier which may now be representated as the voltage $V_{in}$ minus the load voltage at terminal 18', plus a correction voltage $V_c$. $V_c$ equals the voltage feedback through R2. It will be appreciated now that as the error voltage $V_{error}$ declines and reaches the zero level at time T2, that time T2 will occur prior to final steady state output voltage of the amplifier (at T3), as is illustrated in FIG. 6b. This occurs as is illustrated in FIG. 6d wherein the delay in change of output of the amplifier $A'_o$ is fed back to the $A'_o$ input. Therefore, during the interval from T1 to T2 the inherent delay of the amplifier is compensated for in that the observed output at 22 is anticipated by $V_c$ to "signal" reaching the one state at time $T_2$ to stabilize at the steady state level at time T3. From FIG. 6e, it will be observed that the actual feedback signal seen by the amplifier steps up an amount equal to $$V_o \frac{R1}{R1 + R2}$$

by virtue of the feedback from terminal 22 to 16 and that this, in fact, causes the amplifier to believe that at time $T_2$ it has reached the optimum operating level state 1. It will be observed that the feedback voltage continues to rise due to the inherent inertia of the amplifier to point T4 wherein the maximum error in the negative direction is observed as indicated in FIG. 6b. This point, corresponds generally to the fall-off portion of the amplifier output voltage current FIG. 6d. As the slew characteristic of the amplifier carries that output down to the zero level, the load current arrives smoothly at the one state such that the load now sees only a slight rounding of the curve as indicated at T3, (FIG. 6c) representing very short periods of time in the total response time of the amplifier as compared to the settling time illustrated in FIG. 3.

Where the load is capacitive, (as is illustrated in FIG. 7) regulation is done directly across the load (the capacitor). FIG. 7 illustrates the load connection, wherein the capacitor C is connected between terminal 18' and ground and the circut in all other respects is similar to FIG. 4 or 5. Operation of this circuit is identical with that of FIG. 5 and the inductor, e.g. when $R_1'$ in the control amplifier $A_o''$ sees the large difference ($V_{error}$) between the input and the output, the driving amplifier A" will be forced into maximum output (slew). This condition continues until abated by abolishment of the error signal. The overall impact of this step function is however observed by feedback $R_2'$ which moderates the error signal when the load condition approaches the driver output condition. This anticipates the arrival of the driver at the new steady state condition to permit a controlled arrival rather than an arrival at full output capability, thereby allowing quicker stabilization.

In the case where the operational amplifier must work through a current source charging capacitor, the similar philosophy may be employed so long as the resistances R1 and R2 do not significantly load down the capacitance of the capacitor. The circuit also may be used on all capacitive load overdrive circuits in those situations wherein there is significant loading of a charging capacitor. In the latter, a voltage follower may be added at the output of the capacitor to improve the response thereof.

Figure 8:
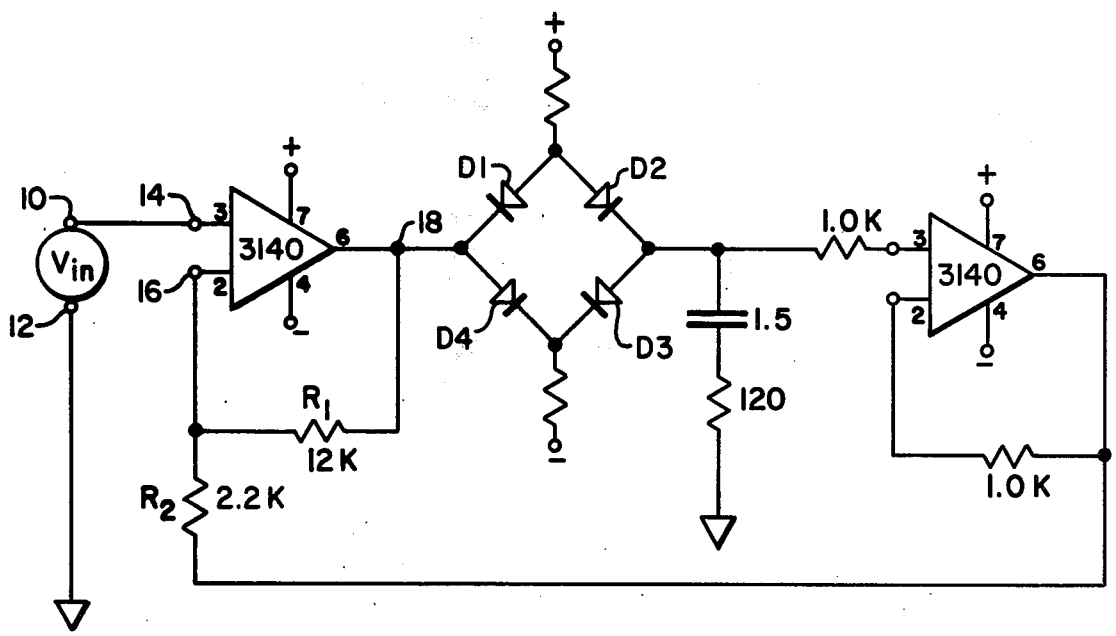
FIG. 8 is a preferred embodiment of the invention of FIG. 7 including a current source charging a capacitor.

Such a circuit is illustrated in FIG. 8 wherein diodes D1–D4 represent the current source switching devices and C represents the charging capacitor and $r_c$ the inherent resistance thereof. Values of the components are indicated on the figure and represents an actual circuit used to drive the Y-axis of a CRT physiological monitor.

It will be appreciated that several modifications and alterations to my invention may be made as it is adapted to specific usages other than the drive for the cathode ray tube. These modifications and departures should be interpreted as within the full scope and spirit of the invention and as encompassed within the scope of the appended claims.

I claim:

1. In a slew limited driving amplifier for supplying a substantially reactive load including an operational amplifier for said driving amplifier and a feedback loop to the operational amplifier from the load regulating means, the improvement comprising the addition of a predetermined resistance $R_1$ in said loop and the inclusion of a second feedback loop having a predetermined resistance $R_2$ from the output of said amplifier to its feedback input, said second feedback loop being substantially in parallel with said driving amplifier resistance $R_1$ and wherein the resistances $R_1$ and $R_2$ have the relationship such that the quantity $$\frac{V_o \left( \frac{R1}{R1 + R2} \right)}{\text{SLOPE}} \geq \text{DELAY}$$

wherein
SLOPE = the slope of the load current curve of the amplifier at overload,
$R_1$ and $R_2$ are feedback resistances in ohms, and
$V_o$ is the output voltage to the amplifier in volts is equal to or greater than a predetermined time, expressed in microseconds, which represents the inertial delay of the loaded current source.

2. The improvement according to claim 1 wherein the driving amplifier is adapted to supply current to an inductive load and is regulated through a shunt resistor and said feedback loop including $R_1$ is interconnected from between said load and shunt resistor to the input to said operational amplifier, and said second feedback loop including $R_2$ is interconnected from the input of said driving amplifier to the input to said operational amplifier.

3. The improvement according to claim 1 wherein the driving amplifier is adapted to supply a voltage to a capacitive load and is regulated through feedback loop including $R_1$ interconnected from between said output of said driving amplifier and said load to the input to said operational amplifier, and said second feedback loop including $R_2$ is interconnected from the input to said driving amplifier to the input to said operational amplifier.

* * * * *